United States Patent
Büyükbas et al.

(10) Patent No.: US 8,004,850 B2
(45) Date of Patent: Aug. 23, 2011

(54) ARRANGEMENT FOR ELECTRICAL AND/OR MECHANICAL COMPONENTS ON A LARGE, FLEXIBLE FOIL TYPE CONDUCTOR AREA

(75) Inventors: Turhan Büyükbas, Nürnberg (DE); Matthias Gramann, Neunkirchen (DE); Klaus Scharrer, Hohenstadt (DE); Peter Guth, Nürnberg (DE); Joachim Buhl, Nürnberg (DE); Dominik Klein, Nürnberg (DE); Bernhard Schuch, Neusitz (DE); Tilo Liebl, Hersbruck (DE)

(73) Assignee: Conti Temic Microelectronic GmbH, Nurnburg (DE)

( * ) Notice: Subject to any disclaimer, the term of this patent is extended or adjusted under 35 U.S.C. 154(b) by 957 days.

(21) Appl. No.: 10/551,725

(22) PCT Filed: Apr. 2, 2004

(86) PCT No.: PCT/DE2004/000717
§ 371 (c)(1),
(2), (4) Date: Aug. 2, 2006

(87) PCT Pub. No.: WO2004/087466
PCT Pub. Date: Oct. 14, 2004

(65) Prior Publication Data
US 2006/0268529 A1 Nov. 30, 2006

(30) Foreign Application Priority Data
Apr. 3, 2003 (DE) .................. 103 15 438

(51) Int. Cl.
*H05K 7/00* (2006.01)
(52) U.S. Cl. ........ 361/760; 361/160; 361/688; 361/704; 361/719; 361/752; 361/836; 174/250; 174/254; 174/255; 174/260; 174/263; 29/846; 438/106; 257/678; 257/686; 257/780

(58) Field of Classification Search .................. 361/760, 361/719, 704, 752, 160, 688, 836; 174/250, 174/254, 255, 260, 263; 29/846; 438/106; 257/678, 686, 780
See application file for complete search history.

(56) References Cited

U.S. PATENT DOCUMENTS

| | | | | |
|---|---|---|---|---|
| 4,858,073 A * | 8/1989 | Gregory | ........................ | 361/708 |
| 5,294,290 A * | 3/1994 | Reeb | .................. | 216/6 |
| 5,469,329 A * | 11/1995 | Reddy et al. | .................... | 361/704 |
| 5,473,511 A * | 12/1995 | Reddy et al. | .................... | 361/719 |
| 5,856,913 A * | 1/1999 | Heilbronner | .................. | 361/760 |
| 6,088,241 A | 7/2000 | Hulsmann et al. | | |
| 6,172,874 B1 * | 1/2001 | Bartilson | ....................... | 361/719 |
| 6,466,454 B1 * | 10/2002 | Jitaru | ............................ | 361/836 |
| 6,703,705 B2 * | 3/2004 | Yamazaki et al. | ............ | 257/692 |
| 6,800,947 B2 * | 10/2004 | Sathe | ............................ | 257/780 |
| 6,812,410 B2 * | 11/2004 | Sakamoto et al. | ............ | 174/260 |
| 6,900,077 B2 * | 5/2005 | Akram | ........................ | 438/125 |
| 6,925,980 B2 * | 8/2005 | Glovatsky | ................ | 123/184.21 |
| 7,220,921 B1 * | 5/2007 | Sakamoto et al. | ............ | 174/261 |
| 2003/0184969 A1 * | 10/2003 | Itabashi et al. | ................ | 361/688 |

FOREIGN PATENT DOCUMENTS

| | | |
|---|---|---|
| DE | 42 25 358 A1 | 2/1994 |
| EP | 38 42 340 A1 | 6/1990 |
| EP | 0490 530 A2 | 6/1992 |
| GB | 1 413 518 | 11/1975 |
| GB | 2 275 373 | 8/1994 |

* cited by examiner

*Primary Examiner* — Xiaoliang Chen

(57) ABSTRACT

The present system and method relate to an arrangement of electrical and/or mechanical components on a large, flexible foil-type conductor area and a method for producing such an arrangement. The flexible foil-type conductor can be easily and flexibly handled and is inexpensive and process-reliable.

9 Claims, 2 Drawing Sheets

ARRANGEMENT FOR ELECTRICAL AND/OR MECHANICAL COMPONENTS ON A LARGE, FLEXIBLE FOIL TYPE CONDUCTOR AREA

BACKGROUND OF THE INVENTION

The invention relates to an arrangement of electrical and/or mechanical components on a large, flexible foil-type conductor area and a method for producing such an arrangement.

Thanks to its merits, the flexible foil-type conductor as a connecting element for different components is increasingly distributed, and that for example in automotive engineering. Thus, for example in the production of a control device for a motor vehicle gear unit, usually at first the layout for the arrangement of the electrical and/or mechanical components as a whole is prepared. Then a foil-type conductor piece, which serves for interconnecting the electrical and/or mechanical components, according to the layout is detached from a large, standardized foil-type conductor area. Afterwards, the foil-type conductor piece is connected to a base plate. Subsequently, the components are arranged and are connected to the foil-type conductor piece.

Already with a less complicated foil layout this proceeding involves a high waste of expensive foil. Moreover, only at a relatively late point of time of the manufacturing process the quality of the contacts of the components to the foil-type conductor can be tested.

In patent specification DE 197 51 095 C1 the arrangement of a control unit in the interior of a motor vehicle gear unit is described, wherein the electrical connecting element between the control unit and the electrical components outside of the housing consists of a single flexible foil-type conductor and fulfills a double function, namely on the one hand to connect the control unit to the electrical components outside of the housing and on the other hand to jointly contact several components existing in the housing. The control unit comprises at least two housing parts which are interconnected in oil-tight manner, through which the electrical connecting element is guided.

Here, the flexible foil-type conductor is made of one piece, what leads to a high waste and thus is uneconomical in case of complex arrangements, if only the recess for the control unit in the center of the foil-type conductor is counted.

Beyond this, with the form of the foil-type conductor the position of the electrical components is fixed inside and outside of the housing and requires a change of form of the entire foil-type conductor, if only one component changes its position. In the manufacturing process this is a serious restriction of the design possibilities.

A further disadvantage of this arrangement is that the function and quality inspection, for example with regard to impermeability of the arrangement or quality of the electrical contacts, can be tested only very late in the manufacturing process. This may possibly result in a very expensive reworking or even in high reject costs.

SUMMARY OF THE INVENTION

It is the object of the present invention to produce an easy and flexible to handle, inexpensive and process-reliable arrangement of electrical and/or mechanical components on a large, flexible foil-type conductor area and to create the method for producing such an arrangement.

This object is achieved by an arrangement with a large folio-type conductor area having mechanical components mechanically connected thereto and having electrical components that are both mechanically and electrically connected thereto.

Advantageously, several electrical and/or mechanical components are combined to suitable assemblies on the large folio-type area. In this case the individual assemblies are arranged on the folio-type conductor partial areas such that their border lines are as long as possible and extend as parallel as possible to the border lines of the large foil-type conductor area. Ideally, the folio-type conductor partial areas are formed as parallel strips. By this way, waste at the large folio-type conductor area is minimized.

The arrangement is extremely variable, as each assembly can comprise electrical and/or mechanical components which are different from each other. In particular within a large folio-type conductor area each assembly can differ from the other. This is ideally suitable for use in the development phase or with small or smallest series.

Advantageously, with the method according to the invention electrical and/or mechanical connecting of the electrical and/or mechanical components to the foil-type conductor is already effected on the large folio-type conductor area. By means of this the quality of the connections can be tested already on the large folio-type conductor area. Then, the tested folio-type conductor sections with the pertaining components can be separated and supplied to the ensuing manufacturing step. This enhances the process reliability of the entire manufacturing process.

Preferably, the folio-type conductor sections are arranged on the large folio-type conductor area such that after separation of the last folio-type conductor partial area the foil waste is reduced to a minimum.

According to an advantageous embodiment of the invention the mechanical connection of the mechanical components to the folio-type conductor area is performed by laminating, SMD mounting or mechanical joining. Thereby, an intricate gluing process is avoided.

In a preferred manner the mechanical connection of the electrical components to the folio-type conductor area is created by soldering or welding. This guarantees a fast and reliable manufacturing process.

Preferably, on the side opposite to the mechanical component of the folio-type conductor area electrical contact surfaces are attached. Thereby, in the further manufacturing process an electrical connection to the other electrical components and or folio-type conductors can be produced.

Advantageously, the mechanical components can be formed as flat cuboidal plates made of metal or plastics. These plates can serve as a support in the production of the electrical connection between the contact areas, which are located on the folio-type conductor area opposite to the mechanical components, and further electrical components and/or folio-type conductors. Furthermore, these plates can also be used in the further manufacturing process a parts of a complete housing and may possibly have in addition an effect sealing the housing.

In accordance with a particularly preferred example of embodiment of the present invention the electrical components are preferably sensors or actuators. They are connected to the folio-type conductor area in particular via separate contacts. The quality of the connection of the electrical and/or the mechanical components to the folio-type conductor area can be tested already directly after production of the respective connection. Thus, in the entire manufacturing process security can be enhanced and costs can be saved by omitting a possible reworking caused when using an untested, damaged assembly.

BRIEF DESCRIPTION OF THE DRAWINGS

A detailed description of the present invention is taken in conjunction with the enclosed drawings.

DETAILED DESCRIPTION OF THE DRAWINGS

Figure 1:
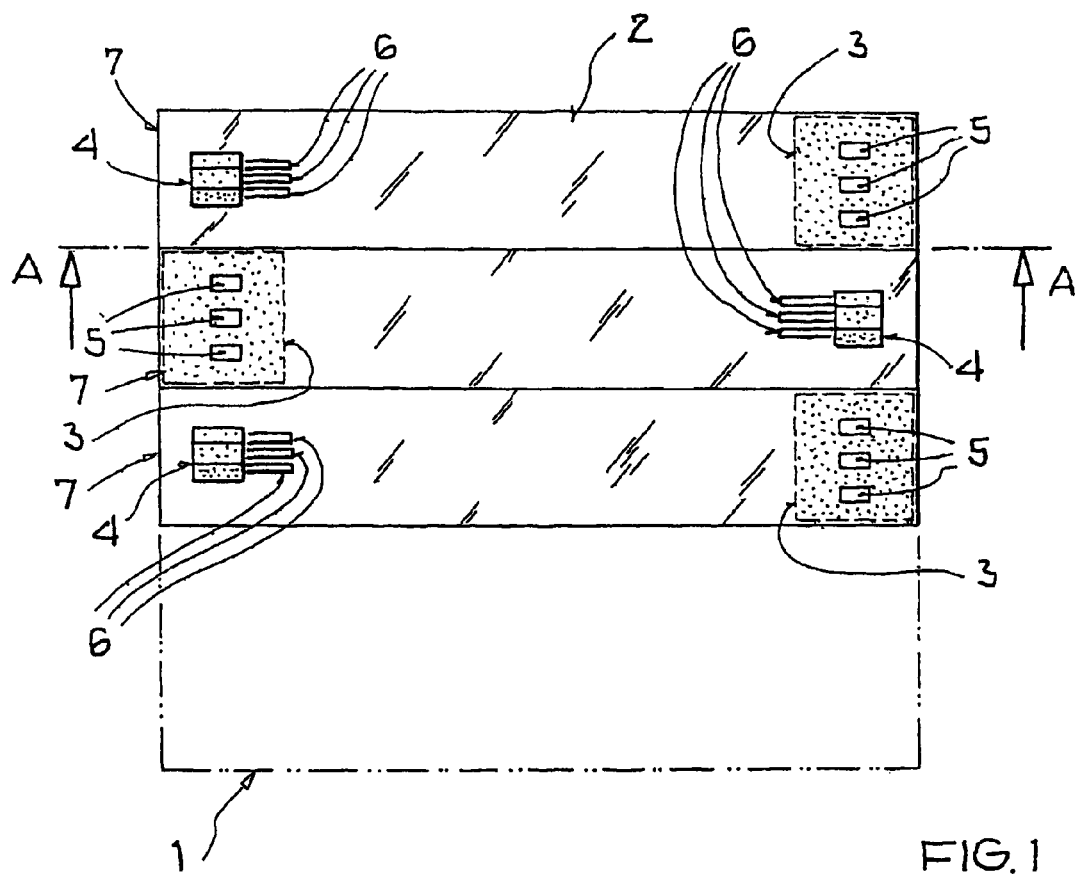
FIG. 1 shows a top view of the arrangement of the electrical and the mechanical components on the large folio-type conductor area.
Figure 2:
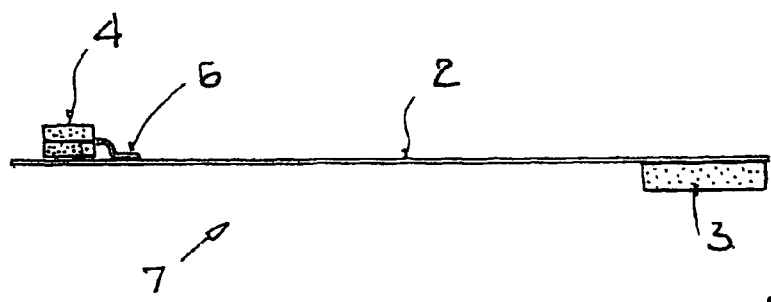
FIG. 2 shows a cut through FIG. 1 in the level A-A.

FIGS. 1 and 2 show a preferred example of embodiment of the invention, the individual assemblies 7, which each comprise an electrical component 4, here an actuator or sensor as an SMD-component, a folio-type conductor piece 2 and a cuboidal plate as a mechanical component 3, hereinafter referred to as bond plate, being identical. The folio-type conductor pieces 2 are embodied as parallel strips on the large folio-type conductor area 1, what ideally reduces waste to zero.

The components 3 and 4 are each arranged opposite to the end of the folio-type conductor strip 2, the electrical component 4 being arranged on the upper side and the mechanical component 3 on the lower side. The mechanical connection of the electrical component 4 to the folio-type conductor piece 2 can be performed by soldering or by welding; electrically they are connected to the folio-type conductor piece 2 in particular via the contact 6.

The mechanical connection of the bond plate 3 to the folio-type conductor piece 2 is created for instance by laminating, SMD mounting; also a connection by mechanical joining would be conceivable. On the side opposite to the bond plate 3 contact surfaces 5 are provided on the folio-type conductor piece 2, by means of which contact surfaces in the ensuing manufacturing process further electrical components can be electrically connected via the folio-type conductor piece 2 to the SMD-component 4.

The quality of the electrical and/or mechanical connections can be tested directly after manufacturing. If all components 3 and/or 4 are arranged on the large folio-type conductor area, the individual assemblies 7 can be separated and processed.

The invention comprises of course all possible combinations of the electrical and/or the mechanical components 3, 4 on the upper side and/or lower side of the large folio-type conductor area 1 and they can also vary from assembly 7 to assembly 7 within a folio-type conductor area. The form of the respective assembly 7 complies with the respective requirements and can also be different from assembly 7 to assembly 7 within the large folio-type conductor area 1.

Figure 3:
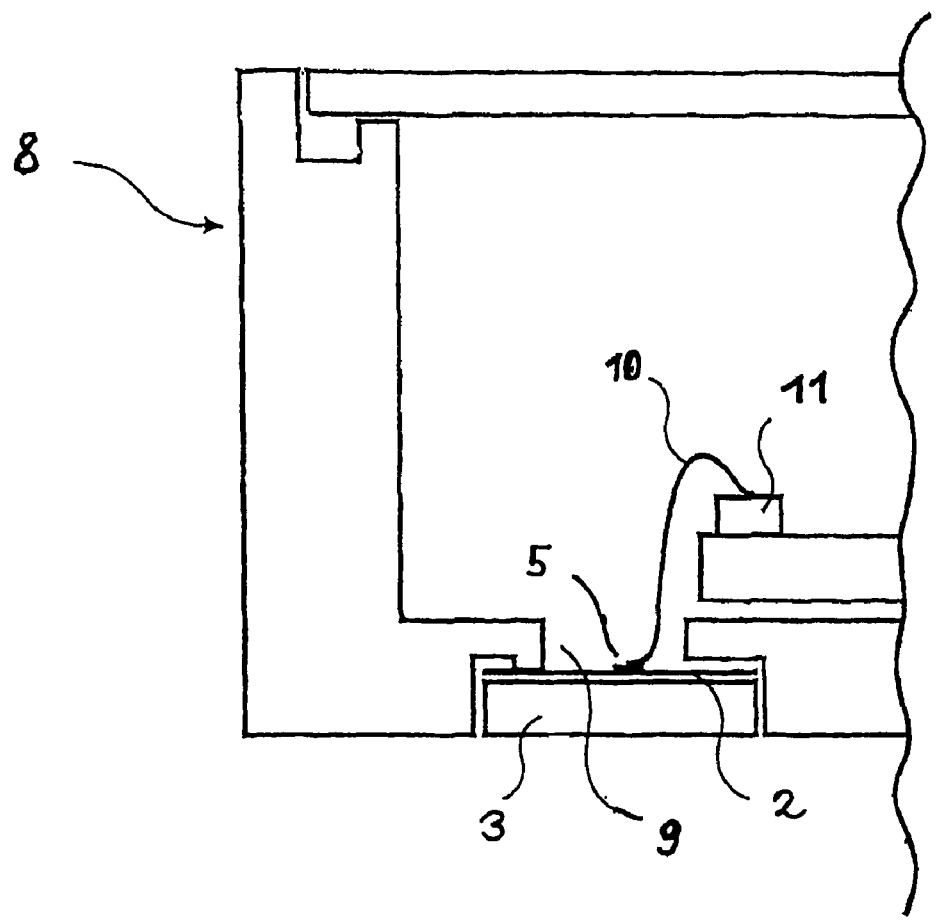
FIG. 3 shows an extract from a schematic cross-sectional view of a housing, the mechanical components being used as part of the housing.

FIG. 3 shows an extract from a schematic cross-sectional view of a housing 8, the bond plate 3 being used as part of the housing 8. At the bottom the housing 8 comprises a recess 9, into which the bond plate 3 is fitted such that the folio-type conductor piece 2 is located between the bond plate 3 and the housing 8. The bond wire 10 produces the electrical connection between the contact surface 5 on the folio-type conductor piece 2 and the electrical unit 11 in the interior of the housing 8. Thus, by the assembly 7 the electrical unit 11 in the interior of the housing 8 is electrically connected to the SMD-component 4 outside of the housing 8. The bond plate 3 can be inserted into the recess 9 for instance by screwing or caulking. Together with the folio-type conductor piece 2 the bond plate 3 can also have an effect sealing the housing 8, in particular against oil. In a manner not shown the sealing effect can be enhanced by attaching an additional sealing between the folio-type conductor piece 2 and the housing 8.

LIST OF REFERENCE NUMERALS

| | |
|---|---|
| 1 | Large flexible folio-type conductor area |
| 2 | Folio-type conductor piece |
| 3 | Mechanical component |
| 4 | Electrical component |
| 5 | Contact surface |
| 6 | Contact |
| 7 | Assembly |
| 8 | Housing |
| 9 | Recess |
| 10 | Bond wire |
| 11 | Electrical unit |

The invention claimed is:

1. A flexible folio-type conductor comprising:
a large, standardized folio-type conductor area;
one or more mechanical component mechanically connected to the folio-type conductor area; and
one or more electrical component mechanically connected to the folio-type conductor area, wherein the one or more electrical component is electrically connected to the folio-type conductor area, wherein two or more of the mechanical component and the electrical component are combined to form assemblies on the folio-type conductor area such that each individual assembly is arranged on a folio-type conductor partial area, which comprises border lines which are as long as possible and extend as parallel as possible to border lines of the large, standardized foil-type conductor area, with each of the mechanical and the electrical components arranged on opposite ends of the folio-type conductor strip with the one or more electrical component arranged on an upper side of the folio-type conductor area and the one or more mechanical component arranged on a lower side of the folio-type conductor area.

2. The device according to claim 1, wherein the one or more mechanical component is a cuboidal plate made of metal or plastics.

3. The device according to claim 1, wherein the one or mechanical component is part of a housing.

4. The device according to claim 1, wherein the one or more electrical component is a sensor or actuator.

5. A method for producing at least one assembly having two or more electrical components or mechanical components on a flexible folio-type conductor, wherein a large, standardized foil-type conductor area is provided, the method comprising:
mechanically connecting mechanical components to the folio-type conductor area;
mechanically connecting electrical components to the folio-type conductor area;
electrically connecting the electrical components to the folio-type conductor area; and separating part of the folio-type conductor area, which comprises an assembly from the folio-type conductor area along predetermined border lines, wherein the step of mechanically connecting the mechanical component includes connecting the mechanical component to a lower side of the folio-type conductor area at one end and connecting the electrical component to an upper side of the folio-type conductor area at an end of folio-type conductor area opposite the mechanical component.

6. The method according to claim 5, wherein on the large, standardized foil-type conductor area with several assemblies which each comprise electrical and/or mechanical components, that part of the folio-type conductor area, which comprises an assembly, is separated from the folio-type conductor area along the predetermined border lines.

7. The method according to claim 6, wherein the two or more electrical components or mechanical components are combined to form assemblies on the folio-type conductor area such that the individual assemblies are arranged on folio-type conductor partial areas, which comprise border lines which are as long as possible and extend as parallel as possible to the border lines of the large, standardized foil-type conductor area.

8. The method according to claim 7, wherein the distribution of the folio-type conductor partial areas on the large folio-type conductor area, the position of the border lines and the resulting form of the folio-type conductor partial areas inclusive the distribution of the components on the folio-type conductor partial area are chosen such that the waste resulting from separating is reduced to a minimum.

9. The method according to claim 5 further comprising:
creating the mechanical connection of the mechanical components created by laminating, SMD mounting or by mechanical joining;
providing electrical contact surfaces on a side opposite to the mechanical component of the folio-type conductor area;
creating the mechanical connection of the electrical components by soldering or by welding; and
producing the electrical connection of the electrical components produced by utilizing the contacts.

* * * * *